United States Patent [19]

Nokubo et al.

[11] 4,237,388
[45] Dec. 2, 1980

[54] INVERTER CIRCUIT

[75] Inventors: Jyoji Nokubo; Hiroshi Mayumi, both of Tokyo, Japan

[73] Assignee: Nippon Electric Co., Ltd., Tokyo, Japan

[21] Appl. No.: 915,686

[22] Filed: Jun. 14, 1978

[30] Foreign Application Priority Data

Jun. 14, 1977 [JP] Japan .................................. 52-69493

[51] Int. Cl.[3] .................... H03K 19/013; H03K 19/20
[52] U.S. Cl. ..................................... 307/214; 307/237; 307/300; 307/DIG. 1
[58] Field of Search ............... 307/213, 214, 237, 300, 307/DIG. 1

[56] References Cited

U.S. PATENT DOCUMENTS

| 3,437,831 | 4/1969 | Seelbach et al. | 307/214 X |
| 3,656,004 | 4/1972 | Kemerer et al. | 307/300 X |
| 3,986,045 | 10/1976 | Lutz | 307/362 X |
| 4,140,926 | 2/1979 | Price | 307/300 X |

Primary Examiner—John Zazworsky
Attorney, Agent, or Firm—Sughrue, Rothwell, Mion, Zinn and Macpeak

[57] ABSTRACT

An inverter circuit operating at a high speed and with low power consumption is disclosed, which comprises a first bipolar transistor having a collector coupled to the output of the circuit, a second bipolar transistor having a collector coupled to the base of the first transistor and means responsive to at least one input signal to produce a first signal for driving the first transistor and a second signal complementary to the first signal for driving the second transistor substantially at the same time.

2 Claims, 7 Drawing Figures

INVERTER CIRCUIT

BACKGROUND OF THE INVENTION

This invention relates to an inverter circuit, and more particularly to an inverter circuit composed of bipolar transistors.

As is well known, inverter circuits are widely used in integrated circuits (hereinafter abbreviated as IC's). Recently, in accordance with great increase in capacity of monolithic bipolar IC's, an operating energy level handled in IC's is being reduced whether they are for logic use or for memory use, and consequently, between the inside and the outside of an IC a difference in energy levels of the respective logic circuits is being increased. More particularly, inside of an IC, as the size of elements and wirings comprised therein is reduced, a current mode logic (hereinafter abbreviated as CML) is widely used because of its operating at a low energy level (in general about 2 volts) and a flexibility in design. While, outside of the IC, a transistor-transistor logic (hereinafter abbreviated as TTL) that operates at a high energy level (in general about 5-6 volts) and has a generality in wide application is widely used. Therefore for transferring logic information from the inside to the outside of IC, a level conversion circuit is necessitated for converting the CML logic level inside of the IC into the TTL logic level outside of the IC.

As the above-referred level conversion circuit, an inverter circuit composed of bipolar transistors has been mainly utilized. A variety of efforts have been made to improve operation speed of such inverter circuit. In order to realize a high speed operation, every transistor has been operated in a non-saturating mode. For this purpose, clamping transistor with a Schottky diode or various circuit arrangements for preventing the saturation has been utilized. Among the transistors to be prevented from saturation as described above, the inverter transistor in the final output stage has especially little tolerance in design. Normally, an output of a TTL is rated, for example, by a collector current of the final stage inverter transistor as high as 16 mA and a very small value of the collector-emitter voltage such as 0.4 volts. For the purpose of operating such an inverter transistor so as to be adapted for a high speed operation, though a method for preventing saturation by reducing a resistance loss in a collector of the transistor, namely by enlarging the dimension of the transistor, has been known, this is almost impossible in view of the fact that the capacitance of the output terminal is required to be as small as possible. In addition, though a method of reducing the resistance value of a pull-down resistor connected in parallel to the base-emitter circuit in order to lower a discharge impedance on the base side at the off-state of the inverter transistor has been known, this results in increase of a power consumption and lowers the operation speed upon on-state of the inverter transistor on the contrary to the desired purpose.

It is one object of the present invention to provide an inverter circuit composed of bipolar transistors which has a high power consumption efficiency, and which can operate at a high speed.

Another object of the present invention is to provide an inverter circuit having a level conversion capability which can operate at a high speed.

DESCRIPTION OF THE INVENTION

The inverter circuit according to the present invention comprises a first transistor having a collector coupled to an output of the inverter circuit, a second transistor having a collector coupled to the base of the first transister, first means responsive to an input signal for applying a first signal to the base of said first transistor, and second means for applying a second signal complementary to the first signal to the base of the second transistor. In this invention, since the first transistor is used for driving an output terminal to which a relatively large load is coupled, the dimension of the first transistor is relatively large and control of a large amount of electric charges in the base is necessary to drive the first transistor. While, the second transistor is used for controlling the first transistor, especially for discharging the electric charges in the base of the first transistor and hence its dimensions may be far smaller than those of the first transistor. As a result, the electric charges treated in the second transistor is smaller than the electric charges treated in the first transistor. The first and second means produce the mutually complementary signals, favorably without delay therebetween.

According to the present invention, the first and second transistors are controlled in their conducting states by the first and second complementary signals. As the first transistor is changed from non-conducting state towards conducting state by the first signal, the second transistor becomes non-conducting state quickly by the second signal due to a small amount of electric charges stored in its base and hence the first transistor quickly takes conducting state. While, as the first transistor is changed from conducting state to non-conducting state, the second transistor quickly becomes conducting state by the second signal and discharges the electric charges accumulated in the base of the second transistor and hence the second transistor becomes conducting quickly. Accordingly, the inverter circuit can operate at a high speed.

According to the present invention, there is also provided an inverter circuit suited for level conversion comprising a current mode logic circuit including first and second transistors having emitters connected in common at a common node, a constant current source connected to the common node, at least one input terminal coupled to one of the bases of the first and second transistors, and first and second terminals connected to the collectors of the first and second transistors, a third transistor having a base connected to the first terminal and a collector connected to an output terminal, a fourth transistor having a base connected to the second terminal and a collector connected to the base of the third transistor, first means interposed between the first terminal and the base of the third transistor for controlling, especially for selectively conducting the third transistor and second means interposed between the second terminal and the base of the fourth transistor for controlling, especially for selectively conducting the fourth transistor.

Now description will be made on the inverter circuits in the prior art to be used as a level converter circuit from CML to TTL with reference to FIG. 1 and FIGS. 2A to 2C.

Figure 1:
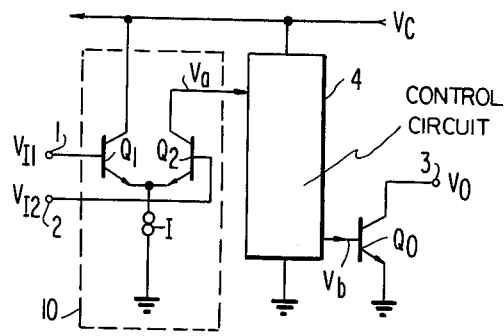
FIG. 1 is a circuit diagram partly in block showing a basic arrangement of an inverter circuit according to the prior art.

As shown in FIG. 1, in an inverter circuit to be used for level conversion from CML to TTL, a constant current source I is connected between the ground and a common node of respective emitters of a pair of transistors $Q_1$ and $Q_2$ to form a current mode logic circuit 10. Input signals $V_{11}$ and $V_{12}$ are respectively applied to terminals 1 and 2 connected to the respective bases of the transistors $Q_1$ and $Q_2$, and among the two transistors $Q_1$ and $Q_2$ whose collectors are connected to a power supply $V_c$. From the collector side of the transistor $Q_2$ is derived an output signal $V_A$. On the other hand, a transistor $Q_o$ forms a final stage output inverter, and from the collection side 3 of this transistor $Q_o$ is derived a signal output $V_o$ at a high logic level. Between the above-referred current mode logic circuit 10 and the inverter consisting of the transistor $Q_o$ is disposed a control circuit 4 which responds to the output signal $V_a$ of the current mode logic circuit 10 to drive the inverter with its output $V_b$.

Figure 2A:
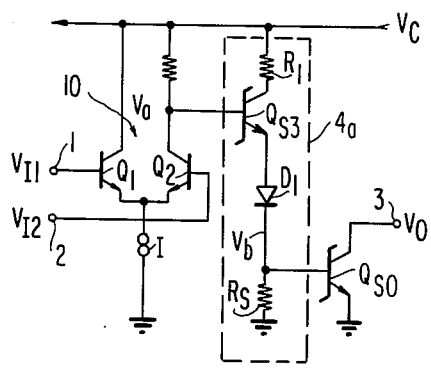
FIG. 2A is a circuit diagram showing details of a first example of the inverter circuit according to the prior art.
Figure 2B:
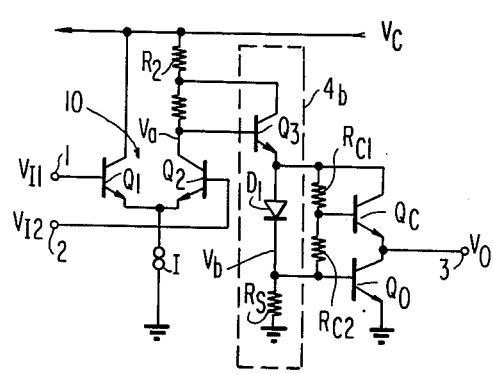
FIG. 2B is a circuit diagram showing details of a second example of the inverter circuit according to the prior art.
Figure 2C:
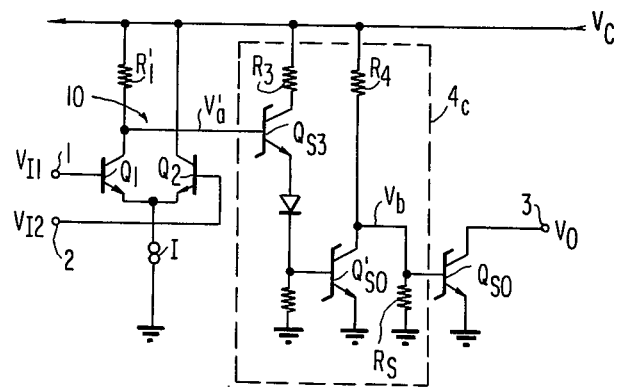
FIG. 2C is a circuit diagram showing details of a third example of the inverter circuit according to the prior art.

Known examples of the inverter circuit including a detailed circuit arrangement of the aforementioned control circuit according to the prior art, are illustrated in FIGS. 2A, 2B and 2C.

FIG. 2A shows a first example in which a control circuit 4a consists of a feeder resistor $R_1$, a control transistor $Q_{s3}$, a level shift diode $D_1$ and a pull-down resistor $R_s$. And transistors $Q_{s3}$ and $Q_{s0}$ are provided with Schottky barrier diodes for clamping them for the purpose of preventing saturation of the transistors.

FIG. 2B shows a second example, in which a control circuit 4b comprising transistor $Q_3$, diode $D_1$ and the pull-down resistor $R_s$ is substantially the same as the control circuit 4a in FIG. 2A. In this example, transistor $Q_c$ is used with resistors $R_{c1}$ and $R_{c2}$ for preventing the saturation in the transistor $Q_o$ in place of the Schottky barrier diodes in FIG. 2A.

The shortcoming of these two examples shown in FIGS. 2A and 2B exists in that the discharge path on the base side of the output inverter transistor $Q_{so}$ or $Q_o$ at its off-state relies upon a pull-down resistor $R_s$. According to such arrangements, if the resistance value of the resistor $R_s$ is high, then the turning off of the transistor $Q_{so}$ or $Q_o$ becomes slow. On the contrary, if the resistance value of the resistor is low, the turning on of the transistor $Q_{so}$ or $Q_o$ becomes slow. If a resistance of a feeder resistor $R_1$ is reduced in order to avoid such a disadvantage, increase of a power comsumption will be resulted. In order to resolve such problems, the circuit illustrated in FIG. 2C has been proposed. In this example, between a current mode logic circuit 10 and a transistor $Q_{so}$ for output inverter use interposed is a transistor $Q_{s'o}$ for inverter use in a control circuit 4c. This transistor $Q_{s'o}$ functions as the so-called active pull-down transistor, and consequently, in distinction from the case where the discharge path relies only upon the resistor $R_s$ shown in FIGS. 2A or 2B, the turning off of the final stage transistor $Q_{so}$ is quickened by utilizing the on-state impedance of the transistor $Q_{s'o}$. However, the efficiency of power consumption is degraded owing to the fact that a large steady current is flowing through a feeder resistor $R_4$ of the transistor $Q_{so}$. And in addition, due to caseade drive of the two stages of inverters, large improvement in the operation speed cannot be expected, because the transistor $Q_{so}$ is controlled by the signal $V_b$ applied via the transistor $Q_{s'o}$ with a delay in the transistor $Q_{s'o}$.

Figure 3:
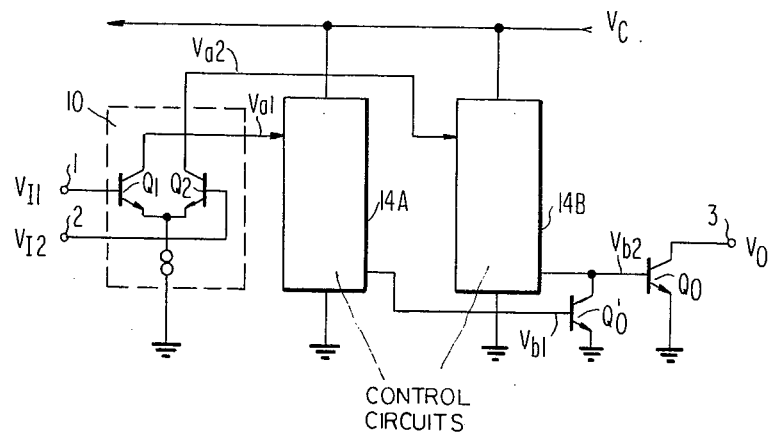
FIG. 3 is a circuit diagram partly in blocks showing a basic arrangement of an inverter circuit according to the present invention.

Now description will be made on preferred embodiments of the inverter circuit according to the present invention with reference to FIGS. 3, 4A and 4B.

At first, a basic circuit arrangement according to the present invention will be described with reference to FIG. 3. Complementary outputs $V_{a1}$ and $V_{a2}$ of a current mode logic circuit 10 consisting of transistors $Q_1$ and $Q_2$ whose emitters are connected in common and grounded via a constant current source I such as a resistor, respectively drive two inverter transistors $Q_o'$ and $Q_o$ by the intermediary of respective control circuits 14A and 14B.

Output complementary signals $V_{b1}$ and $B_{b2}$ from the control circuit 14A and 14B are applied to base electrodes of transistors $Q_o'$ and $Q_o$ respectively. A collector of transistor $Q_o$ is connected to an output terminal 3 for producing a output signal $V_o$. An emitter of transistor $Q_o$ is connected to the ground potential. While, the transistor $Q_o'$ has a collector connected to the base of the transistor $Q_o$ and an emitter connected to the ground potential. The control circuit 14A and 14B produce driving signals $V_{b1}$ and $V_{b2}$ complementary to $V_{b1}$ supplied to the bases of the transistors $Q_o'$ and $Q_o$, in response to the signals $V_{a1}$ and $V_{a2}$ respectively.

The respective signals $V_{b1}$ and $V_{b2}$ have first and second states. The first state, e.g. a high level, makes the transistor $Q_o'$ and $Q_o$ conducting and the second state, e.g. a low level, makes the transistors non-conducting. In this arrangement, the transistor $Q_o$ has far larger dimensions for driving a relatively large load coupled to its collector than the transistor $Q_o'$. Thus, the transistor $Q_o$ at the output stage is controlled with respect to its conducting state by the signal $V_{b2}$ of the control circuit 14B, while the transistor $Q_o'$ whose collector is connected to the base of the transistor $Q_o$ at the output stage is controlled with respect to its conducting state by the signal $v_{b1}$ of the control circuit 14A which is in an opposite phase to the signal $V_{b2}$. In such a circuit arrangement, when the transistor $Q_o$ is turned from its on-state to its off-state in response to the second state of $V_{b2}$, the transistor $Q_o'$ is quickly turned on by receiving the first state of $V_{b1}$, so that it quickly extracts the electric charges accumulated in the base of the transistor $Q_o$ and thereby quicken the speed of the turning off of the transistor $Q_o$. On the other hand, when the signals $V_{b1}$ and $V_{b2}$ are reversed in state and the transistor $Q_o$ changes to turn from its off-state to its on-state in response to the first state of $V_{b2}$, the transistor $Q_o'$ is quickly turned off in response to the second state of $V_{b1}$ because the electric charges accumulated in its base re few due to the fact that the transistor $Q_o'$ has a far smaller current capacity than the transistor $Q_o$ at the output stage. Accordingly, the transistor $Q_o$ can be quickly turned on as controlled solely by the signal $V_{b2}$. Thus the turning off of the transistor $Q_O$ is quickened by the transistor $Q_o'$, and yet the transistor $Q_o'$ does not adversely affect the turning on of the transistor $Q_o$. Accordingly, the operation speed of the transistor $Q_o$ can be improved without increase in the power consumption.

A first preferred embodiment of the present invention will be described with reference to FIG. 4A. In this embodiment, a current mode logic circuit $10_{-1}$ includes a transistor $Q_1$ having a base connected to an input terminal 1 to which an input signal $V_{I1}$ is applied, a transistor $Q_2$ having a base connected to an input terminal 2 to which an input signal $V_{I2}$ is applied, a constant current source I such as a resistor connected between the emitters of the transistors $Q_1$ and $Q_2$ and the ground potential, and collector resistors $R_{L1}$ and $R_{L2}$ connected between a power supply $V_c$ and the collectors of the transistors $Q_1$ and $Q_2$, respectively. A control circuit 14A−1 includes a feeder resistor $R_5$ having its one end connected to the power supply $V_c$, a transistor $Q_{S3}$ having a base supplied with the output potential $V_{a1}$ from the collector of the transistor $Q_1$, a collector connected to the other end of the feeder resistor $R_5$ and a Schottky clamp associated therewith, a diode $D_1'$ having an anode connected to the emitter of the transistor $Q_{S3}$ and a pull-down resistor $R_{S1}$ connected between the cathode of the diode $D_1'$ and the ground potential. While the control circuit 14B−1 includes a feeder resistor $R_6$, a transistor $Q_{S4}$ associated with a Schottky clamp, a diode $D_1$ and a pull-down resistor $R_{S2}$, and these component elements are interconnected similarly to the control circuit 14A−1. A transistor $Q_{S0}$ forming an output stage inverter having a large load driving capability has a base supplied with the signal $V_{b2}$ from the control circuit 14B−1. A transistor $Q'_{S0}$ having a far smaller load driving capability than the transistor $Q_{S0}$, and a base supplied with the signal $V_{b1}$ from the control circuit 14A−1. Both of the transistors $Q_{S0}$ and $Q'_{S0}$ have Schottky clamp.

When differential input signals $V_{I1}$ and $V_{I2}$ are applied respectively to the input terminals 1 and 2 connected to the bases of the transistors $Q_1$ and $Q_2$, complementary output voltages $V_{a1}$ and $V_{a2}$ will appear at the collectors of transistors $Q_1$ and $Q_2$, respectively. Alternatively, one of the input voltage $V_{I1}$ and $V_{I2}$ could be fixed at a D.C. reference level and a signal input could be applied to the other input terminal. The differential outputs $V_{a1}$ and $V_{a2}$ are respectively applied to the bases of the transistors $Q_{S3}$ and $Q_{S4}$ in the control circuits, and then transmitted from the respective emitters of these transistors $Q_{S3}$ and $Q_{S4}$ through the diodes $D_1'$ and $D_1$ to the bases of the inverter transistors $Q'_{S0}$ and $Q_{S0}$, respecitvely. Here it is to be noted that the transistors $Q_{S3}$, $Q_{S4}Q_{S0}'$ and $Q_{S0}$ are high-speed transistors respectively associated with Schottky barrier diodes between their collectors and bases. Between the ground and the base of the transistor $Q'_{S0}$ which is driven by the signal $V_{b1}$ via the diode $D_1'$ is connected a resistor $R_{S1}$ for use as a discharge path and having an appropriate resistance value, and the collector of the transistor $Q_{S0}'$ is connected to the base of the final stage transistor $Q_{S0}$ jointly with the signal $V_{b2}$ via the diode $D_1$. In addition between the ground and the base of the transistor $Q_{S0}$ is connected a resistor $R_{S2}$ whose resistance is selected at a larger value than the resistor $R_S$ appearing in the prior art inverter circuit illustrated in FIG. 2A.

When the diode $D_1'$ has received a high-speed switching signal via the transistor $Q_{S3}$ associated with a Schottky barrier diode, it has shifted the signal level to a lower level and then leads the signal to the base of the transistor $Q_{S0}'$ as the signal $V_{b1}$. The transistor $Q_{S0}'$ can prevent the delay in the inverter operation owing to the effect of the Schottky barrier diode associated therewith, and thereby it can achieve a switching control at a high speed. Since the transistors $Q_{S3}$, $Q_{S4}$, $Q_{S0}'$ and $Q_{S0}$ associated with Schottky barrier diodes, respectively, have a high-speed performance, they are favorable for such use. On the other hand, when the diode $D_1$ has received a switching signal via the transistor $Q_{S4}$, it shifts the level of the signal and then leads the signal to the base of the transistor $Q_{S0}$ as the signal $V_{b2}$ to drive and control the inverter composed of the final stage transistor $Q_{S0}$ in a similar manner to the inverter stage including the transistor $Q_{S0}'$. In this case, since the resistance value of the resistor $R_{S2}$ connected between the ground and the base of the transistor $Q_{S0}$ is selected relatively large, when the transistor $Q_{S0}$ is turned on by the signal $V_{b2}$ applied via the diode $D_1$, the switching speed is not limited by the resistance value. In addition, since the transistor $Q_{S0}'$ is a transistor having a low load drive capability and thus the electric charges accumulated in the base are few, the transistor $Q_{S0}'$ can be quickly turned interrupted in the above-described manner, the transistor $Q_{S0}'$ affects nothing upon the base side of the final stage transistor $Q_{S0}$. On the contrary, when the transistor $Q_{S0}$ is turned off and the transistor $Q_{S0}'$ is turned on in response to the first state of the signal $V_{b1}$ and the second state of the signal $V_{b2}$, owing to the lowering of the on-state impedance of the transistor $Q_{S0}'$, the discharge of the charged energy between the base and emitter of the transistor $Q_{S0}$ is quickened, and therefore, lowering of the switching speed would not occur.

Next, a second preferred embodiment of the present invention will be described with reference to FIG. 4B. In this embodiment, the operations of a current mode logic circuit 10-2 consisting of transistors $Q_1$ and $Q_2$ and a constant current source I, transistors $Q_0'$ and $Q_0$, a control circuit 14A−2 consisting of a transistor $Q_3$, a diode $D_2'$ and a resistor $R_{S1}$, and a control circuit 14B−2 consisting of a transistor $Q_4$, a diode $D_2$ and a resistor $R_{S2}$, are substantially the same as the operations of the corresponding sections in the first embodiment shown in FIG. 4A.

Figure 4A:
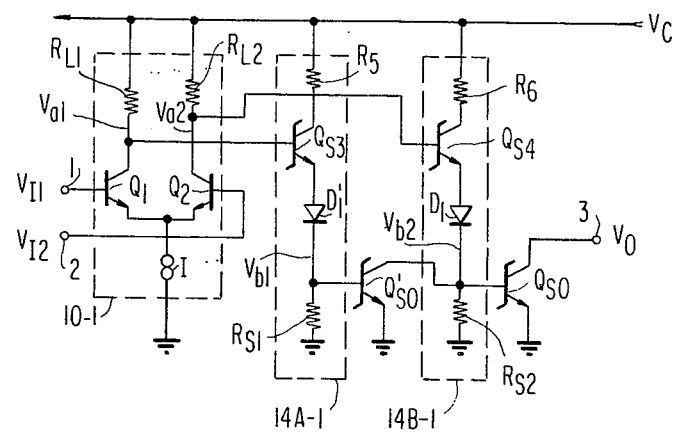
FIG. 4A is a circuit diagram showing a first preferred embodiment of the present invention.

In this Second embodiment, in place of Schottky barrier didoe clamps provided with transistors $Q_{SO}'$ and $Q_{SO}$ in FIG. 4A, transistor $Q_C'$ with resistors $R_{CI}'$ and $R_{C2}'$ and transistor $Q_C$ with resistors $R_{CI}$ and $R_{C2}$ are used for preventing the saturation in transistors $Q_0'$ and $Q_0$ respectively. For instance, in the turning-on operation of the final stage inverter transistor $Q_0$, during the rise in level of the signal $V_{a2}$, the transistor $Q_0$ builds up via the diode $D_2$, and as a drive current to the transistor $Q_C$ is increased, the emitter current of the transistor $Q_C$ serves to suppress the output current flowing through the output terminal 3, resulting in effective saturation prevention. Similarly transistor $Q_c'$ with resistors $R_{cI}'$ and $R_{c2}'$ can prevent the saturation in the transistor $Q_o'$.

Figure 4B:
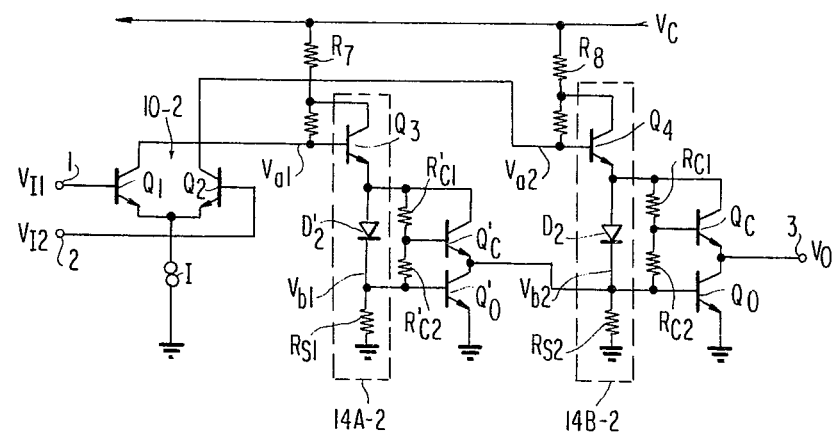
FIG. 4B is a circuit diagram showing a second preferred embodiment of the present invention.

In the circuits according to the preferred embodiments illustrated in FIGS. 4A and 4B, since heavy currents would not flow simultaneously through the feeder resistors R5 and R6 (R7 and R8) which determine the power consumption, the efficiency of power consumption of these circuits is better than that of the prior art inverter circuit illustrated in FIG. 2C. Furthermore, since the load current of the transistor $Q'_{so}$ (or $Q'_0$) in the fore-stage inverter almost does not flow when that transistor is on and has a light load, its switching speed is also high. In addition, in comparison to the inverter circuits shown in FIGS. 2A and 2B, since the transistor $Q_{so}$ (or $Q_o$) for use as an output inverter has its base strongly pulled down by the fore-stage inverter when it changes to off-state, it can achieve high-speed switching.

As will be seen from the above description, according to the present invention, when the transistor of the final stage inverter changes to off state, its discharge impedance on the base side can be controlled to have an extremely low value, by applying two complementary outputs of a CML circuit to the respective ones of the two transistors so as to drive them in opposite phases to each other, so that the utility of the present invention in a monolithic IC circuit is remarkable in that not only the switching characteristics of the final stage inverter are improved, but also these is provided an inverter circuit which has little power consumption and which is effective for the CML-TTL conversion use.

It is to be noted that the present invention should not be limited to the above-described embodiments. For example, the collector of the output transistor ($Q_{so}$ in FIG. 4A or $Q_o$ in FIG. 4B) could be connected to an optional value of power supply through a load element. Moreover, in place of the signals $V_{a1}$ and $V_{a2}$ derived from the current mode logic circuit, a signal derived from other logic circuits or memory circuits can be utilized for the inverter circuit of the present invention by making the output characteristic of the control circuit 14A−1(14A−2) complementary to that of the control circuit 14B−1(14B−2). Also two signals being in opposite phases to each other produced in any kind of circuit can be utilized as the input signals for the inverter circuit of the invention.

We claim:

1. An inverter circuit comprising an output terminal, a first bipolar transistor having a collector coupled to said output terminal, a second bipolar transistor having a collector coupled to the base of said first transistor, a current mode logic circuit including third and fourth bipolar transistors having emitters jointly connected to a common junction point and a power supply, first means for controlling said first transistor, said first means including a fifth bipolar transistor having a base coupled to the collector of said third transistor and an emitter coupled to the base of said first transistor, a second means for controlling said second transistor, said second means including a sixth bipolar transistor having a base coupled to the collector of said fourth transistor and an emitter coupled to the base of said second transistor, first clamp means including a seventh bipolar transistor having a collector coupled to the emitter of said fifth transistor and an emitter coupled to the collector of said first transistor, a first resistor coupled between the collector and the base of said seventh transistor and a second resistor coupled between the base of said seventh transistor and the base of said first transistor, and second clamp means including an eighth bipolar transistor having a collector coupled to the emitter of said sixth transistor and an emitter coupled to the collector of said second transistor, a third resistor coupled between the collector and the base of said eighth transistor and a fourth resistor coupled between the base of said eighth transistor and the base of said second transistor.

2. An inverter circuit comprising an output terminal, a first potential source, a second potential source, a first bipolar transistor having a collector coupled to said output terminal and an emitter coupled to said second potential source, a second bipolar transistor having a collector coupled to the base of said first transistor and an emitter coupled to said second potential source, a current mode logic circuit including a constant current source, a first load means, a second load means, a third bipolar transistor having a collector coupled to said first potential source through said first load means, and a fourth bipolar transistor having a collector coupled to said first potential source through said second load means, emitters of said third and fourth transistors being jointly coupled to said second potential source through said constant current source, first control means including a first diode and a fifth bipolar transistor having a collector coupled to said first potential source, a base coupled to the collector of said third transistor and an emitter coupled to the base of said first transistor through said first diode and to said second potential source and second control means including a second diode and a sixth bipolar transistor having a collector coupled to said first potential source, a base coupled to the collector of said fourth transistor and an emitter coupled to the base of said second transistor through said second diode and to said second potential source, first clamp means including a seventh bipolar transistor having a collector coupled to the emitter of said fifth transistor and an emitter coupled to the collector of said first transistor, a first resistor coupled between the collector and the base of said seventh transistor and a second resistor coupled between the base of said seventh transistor and the base of said first transistor, and second clamp means including an eighth bipolar transistor having a collector coupled to the emitter of said sixth transistor and an emitter coupled to the collector of said second transistor, a third resistor coupled between the collector and the base of said eighth transistor and a fourth resistor coupled between the base of said eighth transistor and the base of said second transistor.

* * * * *

UNITED STATES PATENT AND TRADEMARK OFFICE
CERTIFICATE OF CORRECTION

PATENT NO. : 4,237,388
DATED : December 2, 1980
INVENTOR(S) : NOKUBO et al.

It is certified that error appears in the above—identified patent and that said Letters Patent is hereby corrected as shown below:

Column 3, line 23, delete "$V_{11}$ and $V_{12}$" and insert -- $V_{I1}$ and $V_{I2}$ -- ;

line 28, delete "$V_A$" and insert -- $V_a$ -- .

Column 4, line 1, delete "$Q_{s'o}$" and insert -- $Q'_{so}$ -- ;

line 2, delete "$Q_{s'o}$" and insert -- $Q'_{so}$ -- ;

line 7, delete "$Q'_{so}$" and insert -- $Q'_{so}$ -- ;

line 11, delete "casecade" and insert -- cascade -- ;

line 14, delete "$Q'_{so}$" and insert -- $Q'_{so}$ -- ;

line 15, delete "$Q'_{so}$" and insert -- $Q'_{so}$ -- ;

line 25, delete "$Q_o$," and insert -- $Q'_o$ -- ;

line 30, delete "$Q'_o$" and insert -- $Q'_o$ -- ;

line 30, delete "$Q_o$" and insert -- $Q_0$ -- ;

line 32, delete "a" and insert -- an -- ;

line 34, delete "$Q_o'$" and insert -- $Q'_o$ -- ;

line 38, delete "$Q_o'$" and insert -- $Q'_o$ -- ;

line 42, delete "$Q_o'$" and insert -- $Q'_o$ -- ;

UNITED STATES PATENT AND TRADEMARK OFFICE
CERTIFICATE OF CORRECTION

PATENT NO. : 4,237,388
DATED : December 2, 1980
INVENTOR(S) : NOKUBO et al.

It is certified that error appears in the above—identified patent and that said Letters Patent is hereby corrected as shown below:

Column 4, line 46, delete "$Q_o'$" and insert -- $Q'_o$ --;

line 49, delete "$Q_o'$" and insert -- $Q'_o$ --;

line 52, delete "$v_{b1}$" and insert -- $V_{b1}$ --;

line 56, delete "$Q_o'$" and insert -- $Q'_o$ --;

line 63, delete "$Q_o'$" and insert -- $Q'_o$ --;

line 66, delete "$Q_o'$" and insert -- $Q'_o$ --.

Column 5, line 2, delete "$Q_o'$" and insert -- $Q'_o$ --;

line 3, delete "$Q_o'$" and insert -- $Q'_o$ --;

line 9, delete "$10_{-1}$" and insert -- 10-1 --;

line 54, delete "$Q_{53}$, $Q_{S4}Q_{S0}$" and insert -- $Q_{S3}$, $Q_{S4}$, $Q'_{S0}$ --;

line 60, delete "$Q_{S0}'$" and insert -- $Q'_{S0}$ --.

Column 6, line 3, delete "$Q_{S0}'$" (first and second occurrences) and insert -- $Q'_{S0}$ --;

line 8, delete "$Q_{S0}'$" and insert -- $Q'_{S0}$ --;

lines 16, 22, 24, 26, 29 and 32, delete "$Q_{S0}'$" and insert -- $Q'_{S0}$ --;

UNITED STATES PATENT AND TRADEMARK OFFICE
CERTIFICATE OF CORRECTION

PATENT NO. : 4,237,388

DATED : December 2, 1980

INVENTOR(S) : NOKUBO et al.

It is certified that error appears in the above—identified patent and that said Letters Patent is hereby corrected as shown below:

Column 6, line 40, delete "$Q_0$'" and insert -- $Q'_0$ -- ;

line 42, delete "$D_2$'" and insert -- $D'_2$ -- ;

line 47, delete "Second" and insert -- second -- ;

line 48, delete "didoe" and insert -- diode -- ;

line 48, delete "$Q_{S0}$'" and insert -- $Q'_{S0}$ -- ;

line 49, delete "$Q_C$'" and insert -- $Q'_C$ -- ;

line 49, delete "$R_{C1}$'" and insert -- $R'_{C1}$ -- ;

line 50, delete "$R_{C2}$'" and insert -- $R'_{C2}$ -- ;

line 50, delete " 'and $R_{C2}$" and insert -- and $R_{C2}$ -- ;

line 51, delete "$Q_0$'" and insert -- $Q'_0$ -- ;

line 59, delete "$Q_c$'" and insert -- $Q'_c$ -- ;

line 59, delete "$R_{c1}$'" and insert -- $R'_{c1}$ -- ;

UNITED STATES PATENT AND TRADEMARK OFFICE
CERTIFICATE OF CORRECTION

PATENT NO. : 4,237,388

DATED : December 2, 1980

INVENTOR(S) : NOKUBO et al.

It is certified that error appears in the above—identified patent and that said Letters Patent is hereby corrected as shown below:

Column 6, line 60, delete "$R_{c2}'$" and insert -- $R'_{c2}$ --;

line 60, delete "$Q_0'$" and insert -- $Q'_0$ -- .

Signed and Sealed this

Twelfth Day of May 1981

[SEAL]

Attest:

RENE D. TEGTMEYER

Attesting Officer     Acting Commissioner of Patents and Trademarks